United States Patent [19]
Feliz et al.

[11] Patent Number: 5,168,243
[45] Date of Patent: Dec. 1, 1992

[54] INTEGRATED HIGH GAIN AMPLIFIER

[75] Inventors: George F. Feliz; Carl T. Nelson, both of Santa Clara County, Calif.

[73] Assignee: Linear Technology Corporation, Milpitas, Calif.

[21] Appl. No.: 652,192

[22] Filed: Feb. 6, 1991

[51] Int. Cl.⁵ .............................. H03F 3/45
[52] U.S. Cl. ......................... 330/252; 330/257
[58] Field of Search .............. 330/252, 254, 257, 261, 330/296, 311, 260; 307/296.1, 530

[56] References Cited

U.S. PATENT DOCUMENTS

| | | | |
|---|---|---|---|
| Re. 31,545 | 3/1984 | Quinn | 330/252 X |
| 4,672,326 | 6/1987 | Cini et al. | 330/260 X |
| 4,755,767 | 7/1988 | Yanatake | 330/260 X |
| 4,829,266 | 5/1989 | Pernici et al. | 330/257 X |
| 4,839,609 | 6/1989 | Hara et al. | 330/257 X |
| 5,028,882 | 7/1991 | Marrah et al. | 330/254 |

Primary Examiner—Steven Mottola
Attorney, Agent, or Firm—Flehr, Hohbach, Test, Albritton & Herbert

[57] ABSTRACT

An integrated high gain amplifier in which voltage at the high impedance output node is sensed by sensing voltage excursions which are proportional to the output voltage at another point in the circuit which is coupled to the output node to boost the gain of the amplifier.

6 Claims, 6 Drawing Sheets

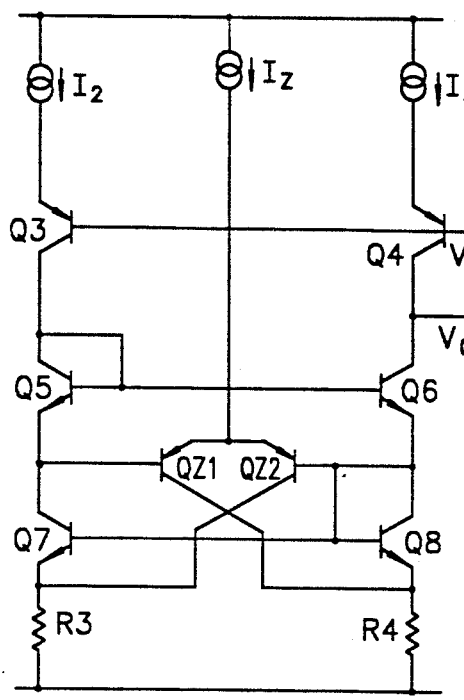
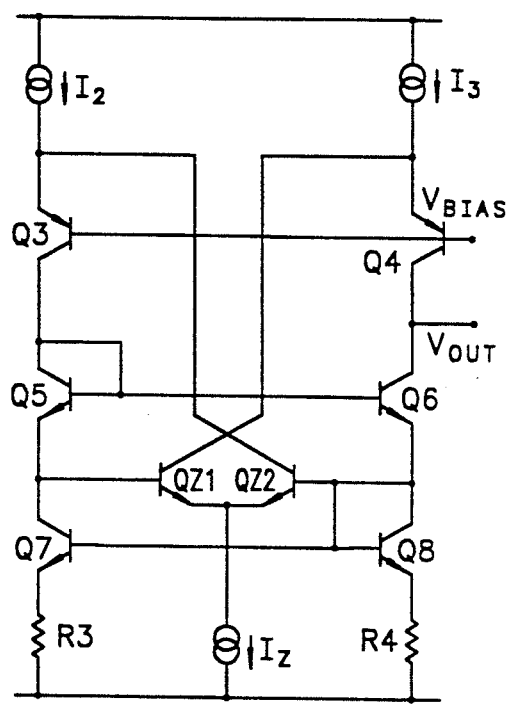
FIG. 8              FIG. 9
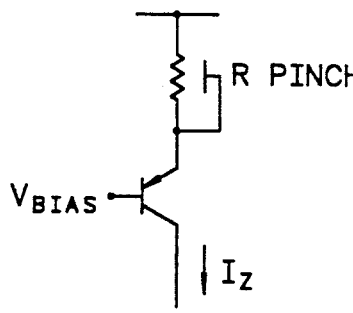
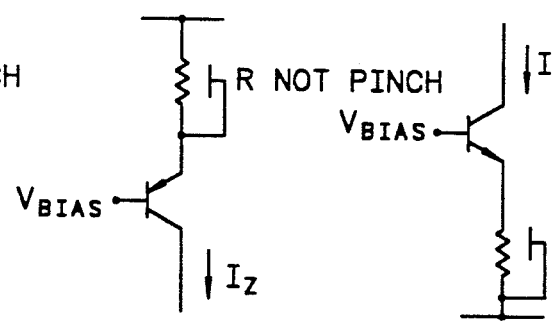
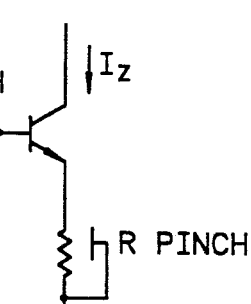
FIG. 14         FIG. 15         FIG. 16

INTEGRATED HIGH GAIN AMPLIFIER

BRIEF DESCRIPTION OF THE INVENTION

This invention relates to an integrated high gain amplifier and more particularly to a high gain amplifier in which the gain is increased by controlling the impedance at the high impedance node of the amplifier.

DESCRIPTION OF THE PRIOR ART

A prior art circuit for boosting impedance is described by G. M. Cotreau in a paper entitled "An Opamp With 375 V/$\mu$s Slew Rate, ±100 MA Output Current, IEEE International Solid State Circuits Conference", Feb. 14, 1985. The method cancels $h_{08}$ or $r_{mu}$ of cascode devices to raise the gain of the amplifier. The method has the drawback that it creates a voltage offset and a drift component that is sensitive to device matching. The increase in gain is limited by device matching.

OBJECTS AND SUMMARY OF THE INVENTION

It is the object of this invention to provide an integrated amplifier circuit in which the increase in gain increases the DC precision and does not degrade the AC performance of the amplifier.

It is another object of this invention to provide a high gain integrated amplifier in which the gain can be trimmed.

It is a further object of the invention to provide a high gain integrated amplifier in which the impedance cancellation is differential, thereby avoiding offset degradation.

It is a further object of the invention to provide an amplifier in which the gain is not limited by device matching.

The foregoing and other objects of the invention are achieved in an amplifier which has a high impedance node, a transistor whose emitter base voltage changes with swing on the high impedance node, a sense circuit which detects changes in the high impedance node voltage via the transistor emitter base and responds to the swing to couple current to the high impedance node to thereby control the gain.

BRIEF DESCRIPTION OF THE DRAWINGS

The foregoing and other objects of the invention will be more clearly understood from the following description when read in connection with the accompanying drawings in which:

FIGS. 4,5,6,7,8,9,10 and 11 show circuits in accordance with still other embodiments of the invention; and FIGS. 12,13,14,15 and 16 show circuits for generating the compensating current, $I_Z$.

DETAILED DESCRIPTION OF THE PREFERRED EMBODIMENTS

This invention relies on the ability to sense the collector voltage of a common-base configuration transistor by measuring the change in voltage at the emitter. A common base configuration (or cascode) consists of a transistor with a fixed base voltage whose input is its emitter current and whose output is its collector current. As the collector-to-emitter voltage is changed the output current changes. In the linear (non-saturation) region the output impedance of the transistor is due to the Early effect and can be characterized at a given operating point. The change in collector current is simply the ratio of the voltage change to the Early Voltage (a measurable characteristic of the transistor commonly denoted by $V_a$). The change in collector current gives rise to a change in base-to-emitter voltage of the transistor. Using the well known exponential relationship between collector current and base-to-emitter voltage of the transistor the change can be calculated in terms of the thermal voltage, $V_t$, the Early Voltage, $V_a$, and the change in collector voltage. This relationship can be approximated by noting that the change in collector voltage is usually much less than the Early Voltage. With this assumption there is a substantially linear relationship between the change in collector voltage and the change in emitter voltage.

Figure 1:
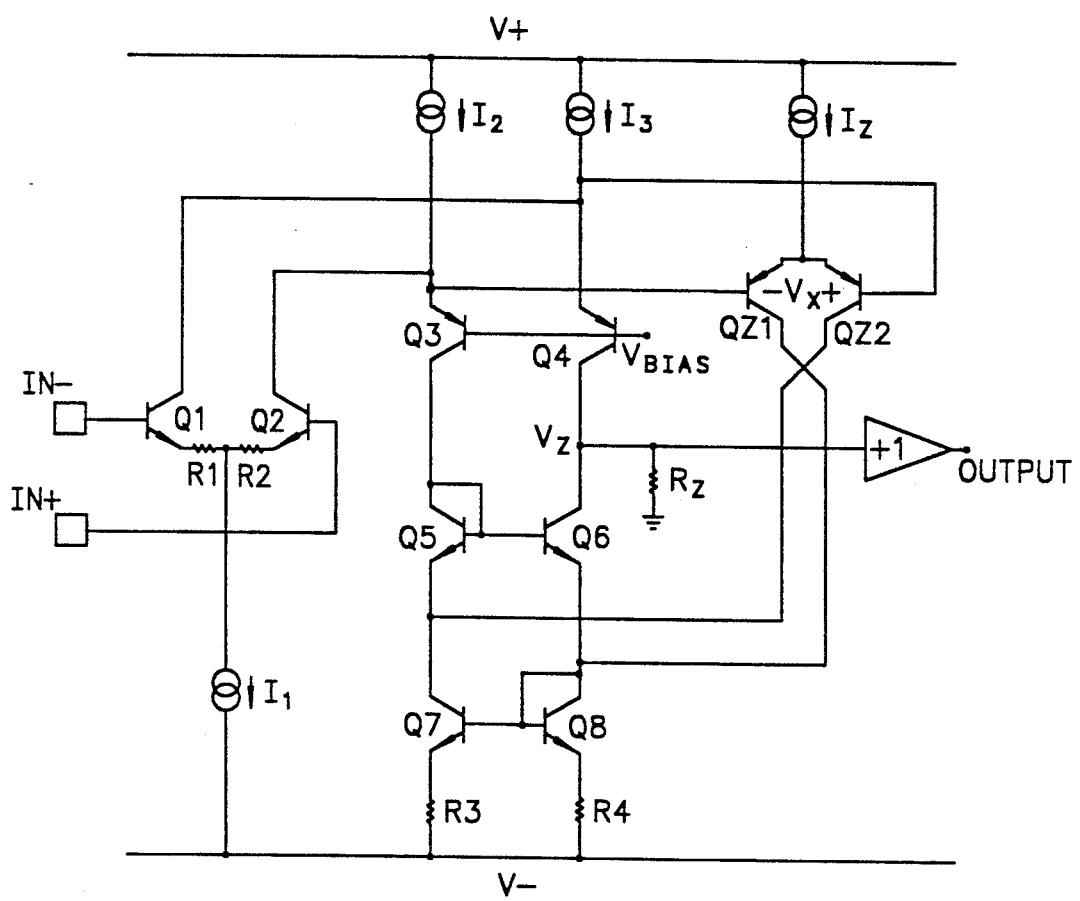
FIG. 1 is a schematic diagram of an integrated high gain amplifier in accordance with one embodiment of the invention.

An amplifier incorporating the invention is shown in FIG. 1. The amplifier has a single gain stage configuration known as a folded cascode. The amplifier operates by taking a differential input voltage which appears across the bases of $Q_1$, $Q_2$, and $R_1$, $R_2$, ($R_1$, $R_2$ are optional) and converting it to a differential current which is subtracted from current sources $I_2$, $I_3$. Resistors $R_1$, $R_2$ are optional and can be eliminated if other circuit components are correctly chosen. The difference currents flow through $Q_3$, $Q_4$. The current through $Q_3$ is inverted and summed by the current mirror (made up of $Q_5$, $Q_6$, $Q_7$, $Q_8$, $R_3$, $R_4$) with the current from $Q_4$ at the high impedance node labeled $V_Z$. The differential current is converted back to a voltage by the total impedance at $V_Z$ which is shown symbolically by resistor $R_Z$. The voltage $V_Z$ is then buffered by a unity gain stage to the output. The voltage gain of the amplifier is determined by $R_Z$ and the transconductance of the input section.

In this invention, the voltage gain is increased by canceling the effect of $R_Z$ as much as possible. The change in voltage at $V_Z$ (as the output swings) is sensed by looking at the change in voltage between the emitters of $Q_3$, $Q_4$ (or alternatively, $Q_5$, $Q_6$). As the collector of $Q_3$ does not move, its emitter voltage remains constant. The emitter voltage of $Q_4$ changes as discussed above. The swing of $V_Z$ causes a current to flow in $R_Z$. The differential pair $Q_{Z1}$, $Q_{Z2}$ senses this swing via the emitters of $Q_3$ and $Q_4$ and compensate for the current flow. Qualitatively, this can be seen if one considers $V_Z$ increasing so that current flows into $R_Z$. The flow of current into $R_Z$ is provided from the collector of $Q_4$. The effect of $R_Z$ can be eliminated if the same amount of current can be subtracted from $Q_6$. The emitter-to-base voltage of $Q_4$ will increase which will cause the current in $Q_{Z1}$ to increase and the current in $Q_{Z2}$ to decrease. The current in $Q_7$ and $Q_8$ will decrease because of the decrease in $Q_{Z2}$ current. The increase in $Q_{Z1}$ current and the decrease in $Q_8$ current combine to decrease the current in $Q_6$. If the current $I_Z$ is selected correctly, the decrease in $Q_6$ current will cancel the effect of $R_Z$ which will boost the voltage gain of the amplifier to a theoretical value approaching infinity. The differential nature of this circuit leads to a low voltage offset contribution because the DC balance of the amplifier is not greatly affected. In fact, the circuit tends to reduce the built-in offset of the circuit due to the imbalance in collector-to-emitter voltages of $Q_3$, $Q_4$.

The current $I_Z$ is set to a value such that the change in current $R_Z$ (due to changes in $V_Z$) is equal to the change in current between $Q_{Z1}$, $Q_{Z2}$ (due to changes in $V_Z$). Thus, they cancel the currents in the amplifier. The result is dependent solely on the Early Voltage of the cascode device and inversely proportional to the impedance $R_Z$. For the nulling to be constant over temperature and processing, the temperature and process dependence of $R_Z$ and the Early Voltage should be incorporated into $I_Z$. As an example, if the value of $R_Z$ is due primarily to $r_{mu}$ of transistor $Q_4$, then $R_Z=(Beta_{Q4})*(Va_{Q4})/Ic_{Q4}$. The value of $I_Z$ is then simply $2*Ic_{Q4}/Beta_{Q4}=2*Ib_{Q4}$.

Many different methods of generating $I_Z$ exist such as mirroring and scaling $I_b$ of a similar pnp elsewhere in the circuit. Another method is to use a pinch resistor constructed similarly to the pnp. Using a pnp-type pinch resistor insures that the current will track variations in the pnp due to process and temperature. For further accuracy $I_Z$ can be trimmed using techniques such as fuse blowing or cutting, zener zapping, or laser trim of thin film resistors. Further enhancements can be made so that the nulling is maintained over changes in the power supply voltages.

Figure 2:
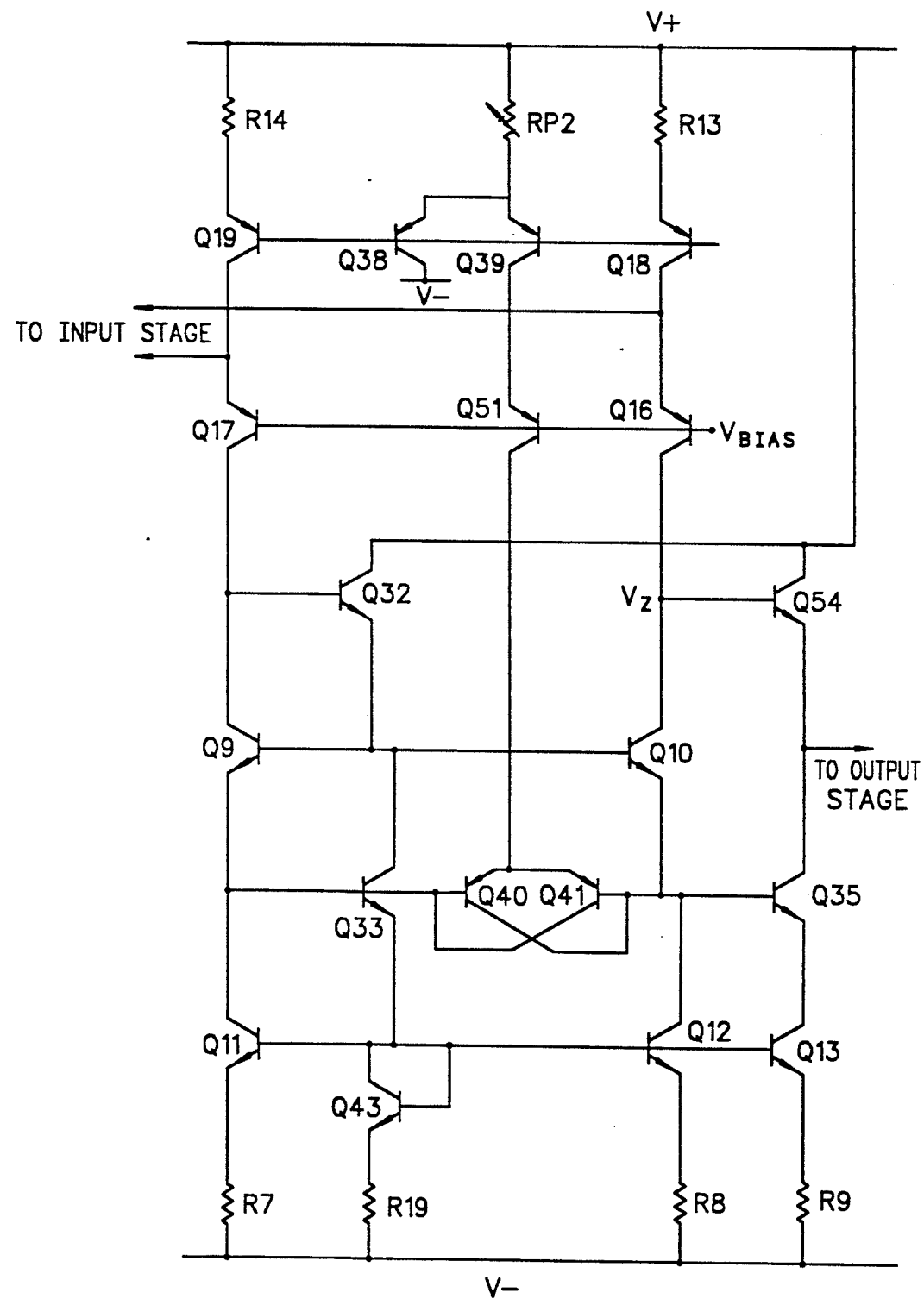
FIG. 2 is a schematic diagram of an integrated high gain amplifier in accordance with another embodiment of the invention.

Some of these enhancements can be seen in FIG. 2. In this circuit $Q_{16}$, $Q_{17}$ are cascode transistors that serve the same function as $Q_3$, $Q_4$ in FIG. 1. A more complex current mirror is used composed of $Q_9$, $Q_{10}$, $Q_{11}$, $Q_{12}$, $Q_{32}$, $Q_{33}$, $Q_{34}$, $R_7$, $R_8$, $R_{19}$. The high impedance node is at the collector of $Q_{10}$ and the collector of $Q_{16}$. This node is buffered by emitter follower $Q_{54}$ which is biased by current source $Q_{13}$, $R_9$ and its cascode device $Q_{35}$. The voltage change on $V_Z$ is sensed at the emitters of $Q_9$ and $Q_{10}$ which are cascode devices. The transistors which sense the voltage are $Q_{40}$, $Q_{41}$ with their output currents being reinserted in the mirror at the convenient low impedance nodes at the emitters of $Q_9$, $Q_{10}$. The current "$I_Z$" is formed by pinch resistor $R_{p2}$ (which is trimmed), and $Q_{38}$, $Q_{39}$, $Q_{51}$. The prime contributor to lowering the impedance at $V_Z$ is the $r_{mu}$ of $Q_{16}$. The resistor $R_{p2}$ is similar in structure to pnp $Q_{16}$ to track its variations over processing and temperature. The rest of the current source is composed of $Q_{39}$ and cascode device $Q_{51}$. Device $Q_{38}$ compensates the current for changes in power supply voltage.

Figure 3:
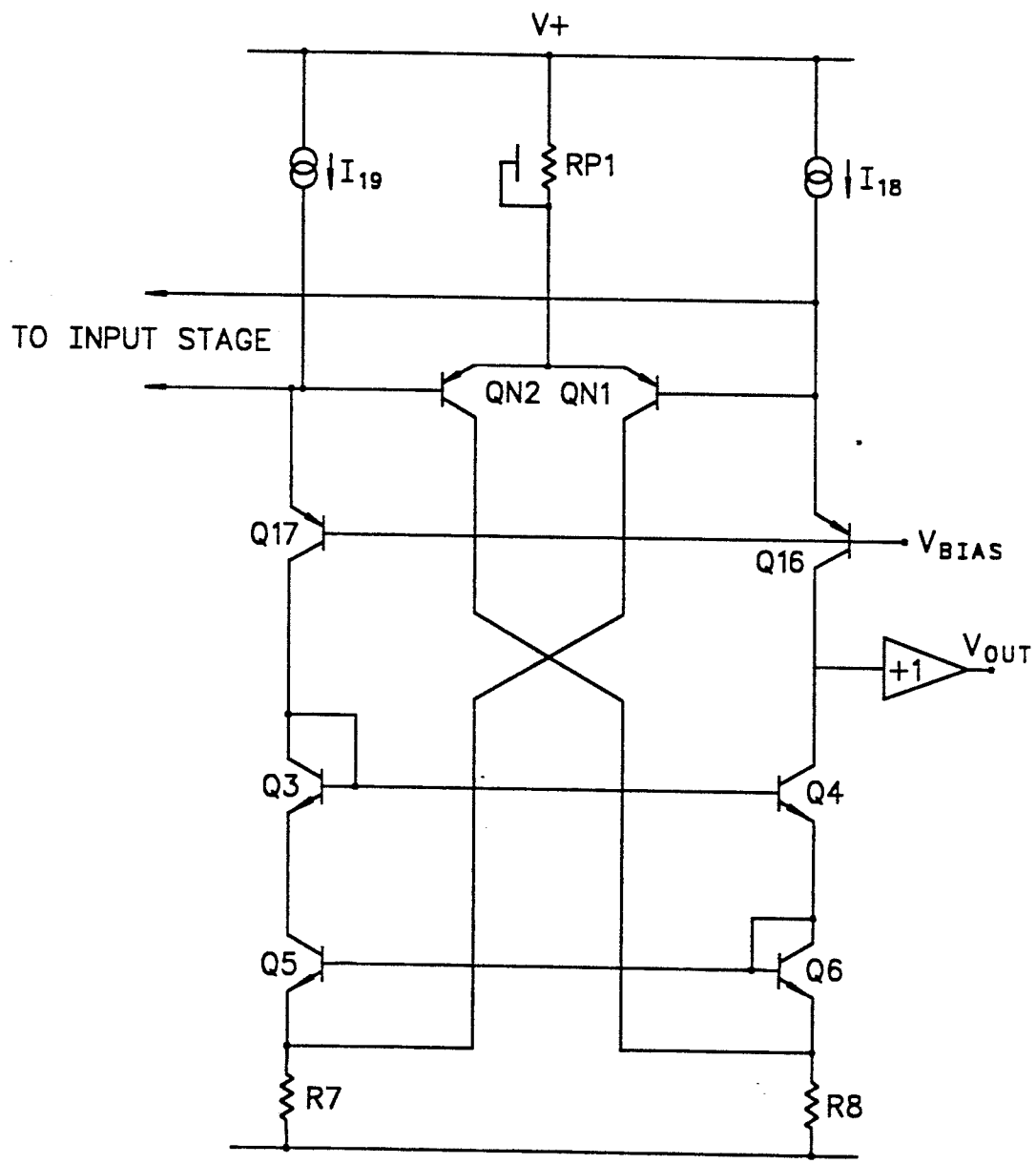
FIG. 3 is a schematic diagram of an integrated high gain amplifier in accordance with still another embodiment of the invention.
Figure 4:
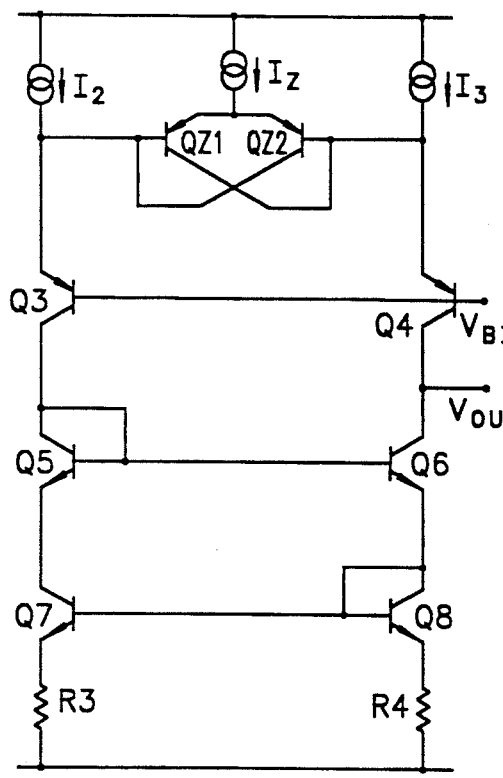
Figure 5:
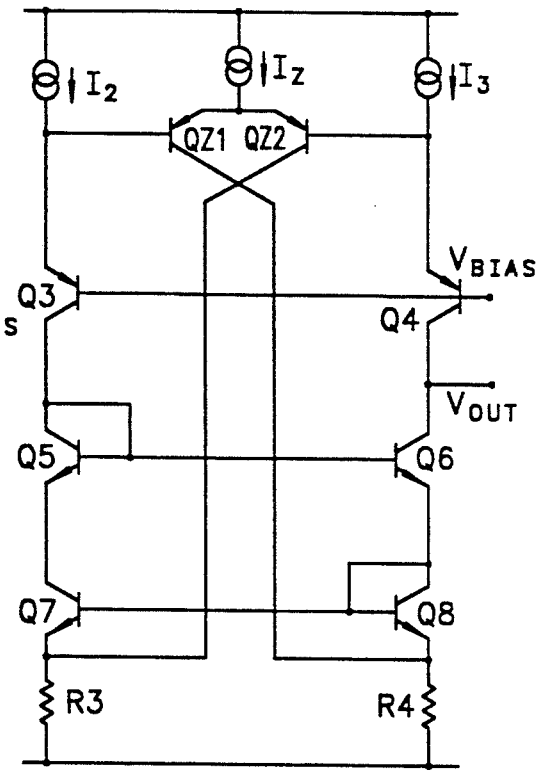
Figure 6:
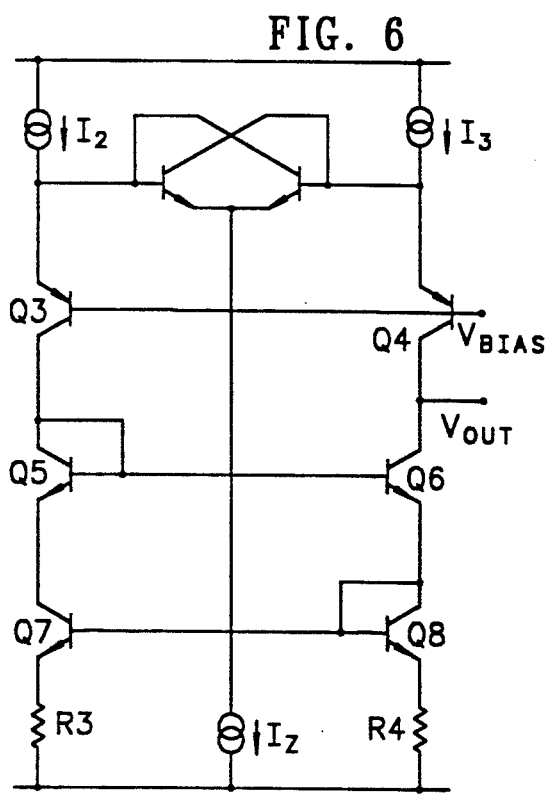
Figure 7:
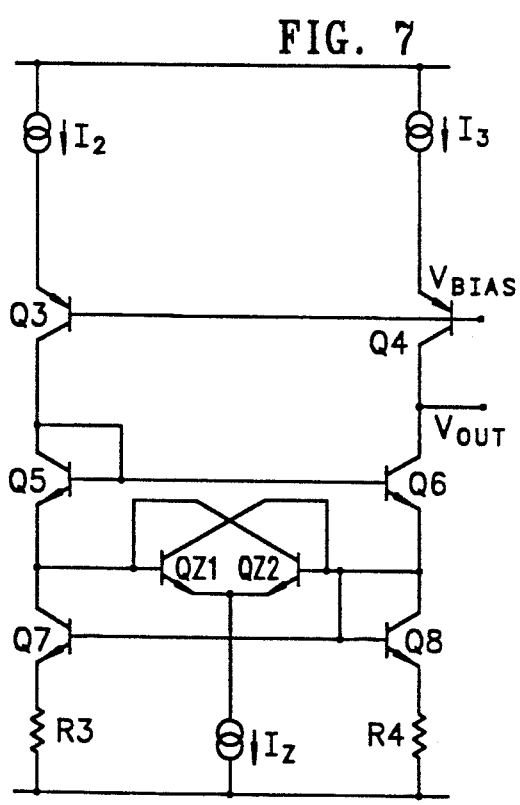

Another embodiment of the invention is shown in FIG. 3. In this embodiment the sense voltage is at the emitters of cascode devices $Q_{16}$, $Q_{17}$. The sense devices $Q_{N1}$, $Q_{N2}$ feed their outputs into low impedance nodes at the emitters of $Q_5$, $Q_6$ in the current mirror. The current "$I_Z$" is set by a pnp-type pinch resistor $R_{p1}$ and the voltage drop set up between $V^+$ and $V_{bias}$ minus the $V_{be}$'s of $Q_{16}$, $Q_{17}$, $Q_{N1}$, $Q_{N2}$. This is a simpler implementation which may or may not employ trimming.

Referring to FIG. 1, there are two possible sense positions: at the emitters of $Q_3$, $Q_4$; or at the emitters of $Q_5$, $Q_6$. The voltage can be sensed differentially by either npn or pnp transistors. The differential correction current can be inserted at different low impedance points: the emitters of $Q_3$, $Q_4$; the emitters of $Q_5$, $Q_6$; or the emitters of $Q_7$, $Q_8$. The current $I_Z$ can be created in many different ways: current mirrors, pinch resistors, regular resistors. The current $I_Z$ should depend on the primary contributors to lowering $R_Z$ in order to optimize the effect and its generation should relate to those contributors so that it tracks changes in processing and temperature.

Figure 10:
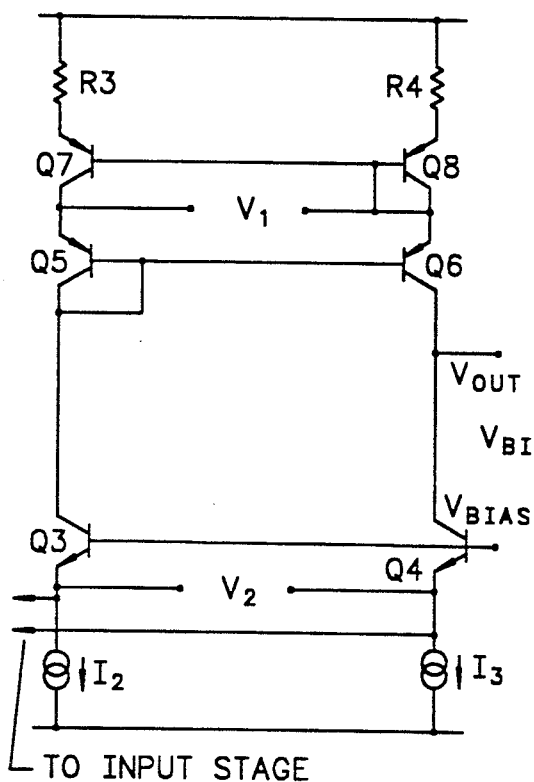
Figure 11:
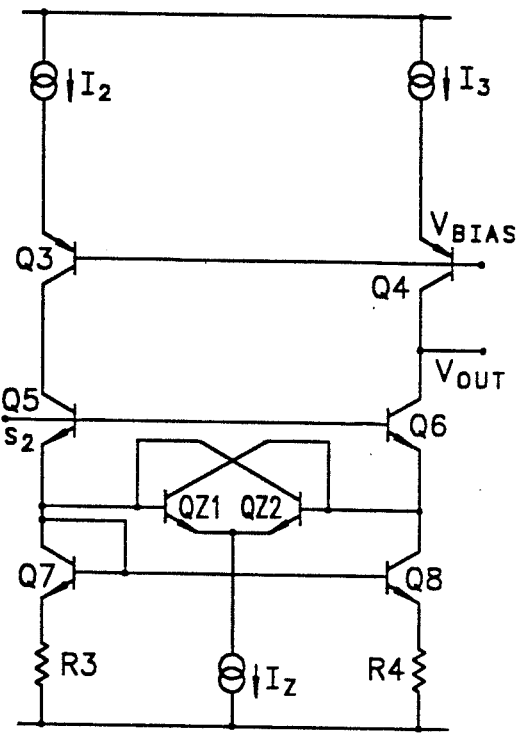
Figure 12:
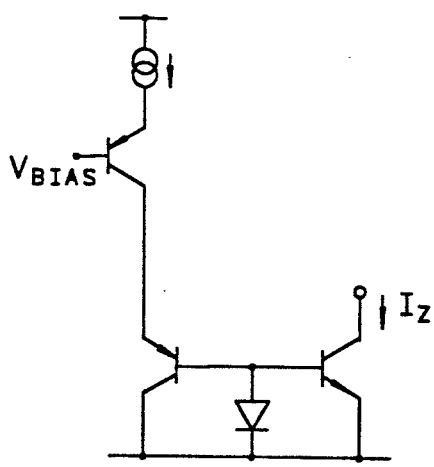
Figure 13:
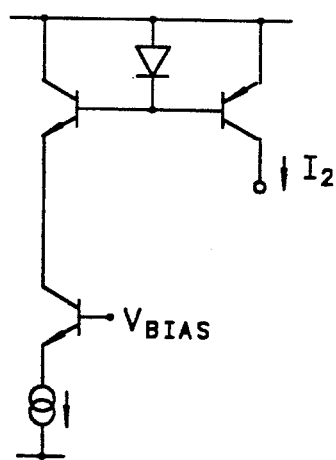

Some of the variations on the basic circuit of FIG. 1 are shown in FIGS. 4-9. Other variations include inverting the folded cascode so that the mirror is formed of pnp transistors and the cascode transistors are npn's. This variation, shown in FIG. 10, has two sense positions also: $V_1$ and $V_2$, and can use either pnp or npn differential pairs. Alternatives can be found by providing cascode transistors differently such as in the circuits of FIG. 3 or FIG. 11. Methods of generating $I_Z$ are too numerous to include, but some representative methods are shown in FIG. 12-16.

There are many variations on the basic circuit. The common ingredients are: sensing the voltage swing at the high impedance node of a gain stage by looking at the change in voltage at the emitter of a cascode device feeding the high impedance node; sensing the voltage differentially so as not to degrade input offset voltage; generation of a compensating current that tracks the impedance to be canceled; returning a compensating correction current to low impedance nodes; and optionally trimming the compensating current to optimize the gain.

What is claimed:

1. In an amplifier circuit having a high impedance node
   a circuit including a transistor with its collector coupled to said high impedance node, and
   a sense circuit for sensing the emitter base voltage of said transistor and generating a correction current which is coupled to said high impedance node to boost the gain of the amplifier.

2. An amplifier comprising an input stage providing differential drive signals,
   a differential amplifier circuit connected to receive said drive signals and drive a high impedance node,
   means for sensing change in voltage at said high impedance node and providing a current to said high impedance node to compensate for the change of current due to the change in voltage sensed at said high impedance node.

3. An amplifier comprising an input stage providing differential drive signals,
   a differential amplifier circuit connected to receive said drive signals and drive a high impedance node,
   means for sensing change in voltage at said high impedance node and providing a current to compensate for the change of current due to the change in voltage sensed at said high impedance node, and
   wherein said means for sensing the change in voltage at the high impedance node comprises a differential amplifier serving to control the current from a source coupled to said high impedance node.

4. An amplifier comprising an input stage providing differential drive signals,
   a differential amplifier circuit connected to receive said drive signals and drive a high impedance node,
   means for sensing change in voltage at said high impedance node and providing a current to compensate for the change of current due to the change in voltage sensed at said high impedance node.

wherein said means for sensing change in voltage at the high impedance node comprises a differential amplifier serving to control the current from a source coupled to said high impedance node, and wherein the current is determined by a pinch resistor.

5. In an amplifier circuit having a high impedance node
   a circuit including a transistor with its collector coupled to said high impedance node,
   a sense circuit for sensing the emitter base voltage of said transistor and generating a correction current which is coupled to said high impedance node to boost the gain of the amplifier, and
said amplifier circuit comprises a pair of cascode devices, one of which feeds the high impedance node and whose emitter tracks the high impedance node and an emitter coupled pair of transistors whose bases are connected to sense the voltage at the emitters of said pair of cascode devices and whose emitters have a current which tracks the impedance of the high impedance node and whose collectors feed currents which are coupled to the high impedance node.

6. An amplifier as in claim 1 whose correction current is fed to a low impedance node in the circuit that couples to the high impedance node.

* * * * *

UNITED STATES PATENT AND TRADEMARK OFFICE
CERTIFICATE OF CORRECTION

PATENT NO. : 5,168,243

DATED : December 1, 1992

INVENTOR(S) : George F. Feliz, Carl T. Nelson

It is certified that error appears in the above-identified patent and that said Letters Patent is hereby corrected as shown below:

IN THE ABSTRACT:

Line 2, delete "output"
    Line 5, change "output" to --high impedance--

IN FIGURE 2:

Change "Q43" to --Q34--

IN THE TEXT:

Column 1, line 16, change "$h_{o8}$" to --$h_{0b}$--

Column 2, lines 33-34, delete "($R_1$, $R_2$ are optional)"

Signed and Sealed this

Twenty-third Day of November, 1993

*Attest:*

BRUCE LEHMAN

*Attesting Officer*      *Commissioner of Patents and Trademarks*